(12) United States Patent
McGrath (10) Patent No.: US 6,169,318 B1
(45) Date of Patent: Jan. 2, 2001

(54) CMOS IMAGER WITH IMPROVED SENSITIVITY

(75) Inventor: Robert Daniel McGrath, Andover, MA (US)

(73) Assignee: Polaroid Corporation, Cambridge, MA (US)

(*) Notice: Under 35 U.S.C. 154(b), the term of this patent shall be extended for 0 days.

(21) Appl. No.: 09/028,072

(22) Filed: Feb. 23, 1998

(51) Int. Cl.[7] ................................................. H01L 29/72
(52) U.S. Cl. .......................... 257/445; 257/282; 257/369; 257/431; 257/444
(58) Field of Search .................................. 257/282, 369, 257/431, 444, 445

(56) References Cited

U.S. PATENT DOCUMENTS

| | | | |
|---|---|---|---|
| 3,680,484 | 8/1972 | Stetter | 102/513 |
| 4,643,098 | 2/1987 | Gudbrandsen et al. | 102/513 |
| 4,721,042 | 1/1988 | Moate | 102/343 |
| 5,698,874 | * 12/1997 | Hayashi | 257/292 |

FOREIGN PATENT DOCUMENTS 1236416  6/1971  (GB) .............................. F42B/11/16

* cited by examiner

Primary Examiner—Edward Wojciechowicz
(74) Attorney, Agent, or Firm—Barry Gaiman; Wolfgang E. Stutius (57) ABSTRACT

An improved pixel design for a CMOS image sensor with a small feature size is described. In conventional image sensors of this type, the quantum efficiency is typically reduced as a result of the decreased thickness of the top n-type layer of the photodiode and the presence of an intervening p-type layer which is higher doped than the substrate. In the pixel design of the invention, the higher doped p-type layer underneath the photodiode is omitted while barrier regions channel the carriers generated by the impinging radiation towards the top n-layer of the photodiode. A high quantum efficiency is thereby attained in spite of a shrinking feature size. The novel pixel design can also incorporate anti-blooming protection.

16 Claims, 6 Drawing Sheets

CMOS IMAGER WITH IMPROVED SENSITIVITY

BACKGROUND OF THE INVENTION

1. Field of the Invention

This invention relates to an improved pixel design for a CMOS imager. More particularly, the invention relates to a pixel design which maintains a high quantum efficiency in spite of a shrinking feature size thereby providing highly sensitive sensors with a high pixel density. The novel pixel design can also incorporate anti-blooming protection.

2. Description of Related Art

Solid-state image sensors, such as CCD and CMOS based image sensors, are commonly used as input devices for electronic video and still cameras, machine vision, etc. The sensors are comprised of pixels arranged in rows and columns, for example in 512 rows and 768 columns for a total of approximately 400,000 pixels in an image sensor with a moderate resolution. The spatial resolution of an electronic imaging device is limited by the number of pixels; high resolution image sensors for generating prints with a quality approaching that of photographic pictures recorded on conventional color film require in excess of 1 million pixels per imager. As a result, the lateral dimensions and feature size of the individual pixels in high resolution image sensors decrease with increasing number of pixels per unit area. As the feature size in advanced CMOS processes shrinks, the doping levels and layer thicknesses have to be scaled accordingly and additional process steps are added to enhance circuit performance. On the other hand, the optically active volume from which photo-generated charge can be collected, has to remain large enough for collecting a sufficient amount of radiation energy at the wavelength of interest, in particular at wavelengths between about 300 nm and about 800 nm, i.e. in the UV-IR spectral range. Because the absorption constant for optical radiation in semiconductors generally decreases with increasing wavelength, i.e. the red-IR portion of the light is penetrates the semiconductor to a greater depth than the blueUV portion of the light, the red-IR portion generates electric charges farther away from the semiconductor surface or the p-n junction of the photo element, respectively. The spectral response of a Si p-n junction solar cell which has substantially the same structure as the photo element of a CMOS image sensor, is discussed, for example, in S. M. Sze, *Physics of Semiconductor Devices*, John Wiley & Sons (1981), p. 800–805.

A simple CMOS technology employs two basic types of FET's, namely n-MOS FET's and p-MOS FET's. Most CMOS processes start with a p-doped substrate or with a p-type epitaxial layer deposited by known methods on a substrate of a different doping-type, such as an insulating or n-type substrate, with the substrates predominantly made of silicon. The p-dopant level of the substrate is typically around $1 \times 10^{15}$ cm$^{-3}$. Other substrates, for example sapphire, can also serve as carriers for the p-type epitaxial layer. Both the p-doped substrate and the p-type epitaxial layer with hereinafter be referred to as p-substrate. N-MOS FET's are built in the uniformly doped p-type substrate through patterning of an active window with a gate oxide having an active gate disposed thereon, wherein the active area not covered by the gate is subsequently doped n$^+$-type by known methods to a level of typically $1 \times 10^{19}$ to $1 \times 10^{21}$ cm$^{-3}$. P-MOS FET's are built in an n-type well formed in the p-doped substrate through patterning of an active window with a gate oxide having an active gate disposed thereon, wherein the active area not covered by the gate is subsequently doped p-type.

The photo element of CMOS image sensor pixels is typically a simple diode in the form of an n$^+$-well formed in the p-type substrate; if the source or drain region of an n-MOS FET transistor is to be electrically connected to the n$^+$-well of the photo element, then the n$^+$-doping region can be contiguous between these two devices. An n-MOS FET of this type is used, for example, to first set the n$^+$-doping region to a positive voltage and then to isolate the n$^+$-doping region for integrating the charges generated by the impinging radiation. The pixel preferably includes additional FET's for buffering the generated charge as well as for selectively connecting the photo element and/or a sense node to a bias for reset and to a circuit for readout. The FET's are connected row-wise and column-wise to row-select and row-rest lines for selecting and resetting the pixels and to column-wise signal lines for reading out the photo-generated signals in a manner known in the art.

As the feature size in advanced CMOS processes shrinks, the doping levels and layer thicknesses are scaled accordingly, and additional process steps known in the art are added to enhance device performance. More particularly, n-MOS FET's with small gate length require a higher p-doping level in the gate channel; in a typical process, the n-MOS FET's are formed by first forming in the substrate a p-well with a higher p-doping level than the substrate extending area-wise across the entire source-gate-drain region. The source and drain regions are subsequently formed by n$^+$-doping the p-well. In the typical CMOS process adapted to small feature sizes, the photo element is usually also formed in such higher p-doped well instead of directly in the substrate. This is disadvantageous for the reasons described below.

As mentioned before, the photo element collects the electric charges (electrons in the n$^+$-region and holes in the p-well and/or substrate) generated by the optical radiation impinging on the CMOS image sensor. Charge collection begins when the photo element is isolated from a reference voltage $V_{REF}$ by removing the gate voltage from the row reset FET; the electrons or holes then drift or diffuse until they cross the space-charge region near the p-n$^+$ interface, causing the reverse bias across the photo element to decrease. However, with shrinking feature size, as described before, the doping levels, especially that of the p-doped active area of the FET'S, are preferably increased above the doping level of the p-doped substrate to control the electrical device parameters. This higher doped p-layer creates a diffusion barrier for the electrons which are generated at a greater depth inside the p-doped substrate or epilayer, which can prevent these electrons from reaching the n$^+$-doping region. Consequently, the quantum efficiency of the CMOS image sensor is decreased, in particular in the red-IR spectral range, as discussed above. Moreover, these electrons may also drift laterally to adjacent pixels and thus impair the spatial resolution and induce blooming at higher incident radiation intensity.

SUMMARY OF THE INVENTION

With the foregoing in mind, it is therefore an object of the invention to provide an improved CMOS image sensor with an efficient charge collection efficiency, in particular at high pixel densities and small feature sizes. It is another object of the invention to provide a CMOS image sensor wherein the spectral response to the wavelength of the incident optical radiation is not adversely affected by the doping levels required for the peripheral devices, such as the FET's integrated with the pixel.

It is still another object of the invention to reduce blooming effects at high incident radiation levels.

These objects are solved by the invention by forming only the n-MOS FET's in p-wells with an increased p-doping concentration and forming the photo element itself in the lower p-doped substrate.

In another advantageous embodiment, the p-doping concentration is increased only in the FET channel, but not underneath the source and drain regions of the FET's. In yet another advantageous embodiment, the higher p-doped regions extend along the periphery of the photo element and possibly also along the periphery of at least some of the source and drain regions of the FET's.

BRIEF DESCRIPTION OF THE DRAWINGS

Other objects and attainments together with a fuller understanding of the invention will become apparent and appreciated by referring to the following description and claims taken in conjunction with the accompanying drawings.

In the drawings is shown in.

DESCRIPTION OF THE PREFERRED EMBODIMENTS

Several preferred embodiments of the invention will be described hereinafter with reference to the drawings. Like parts and parts performing similar functions are referenced with like reference numerals.

Figure 1:
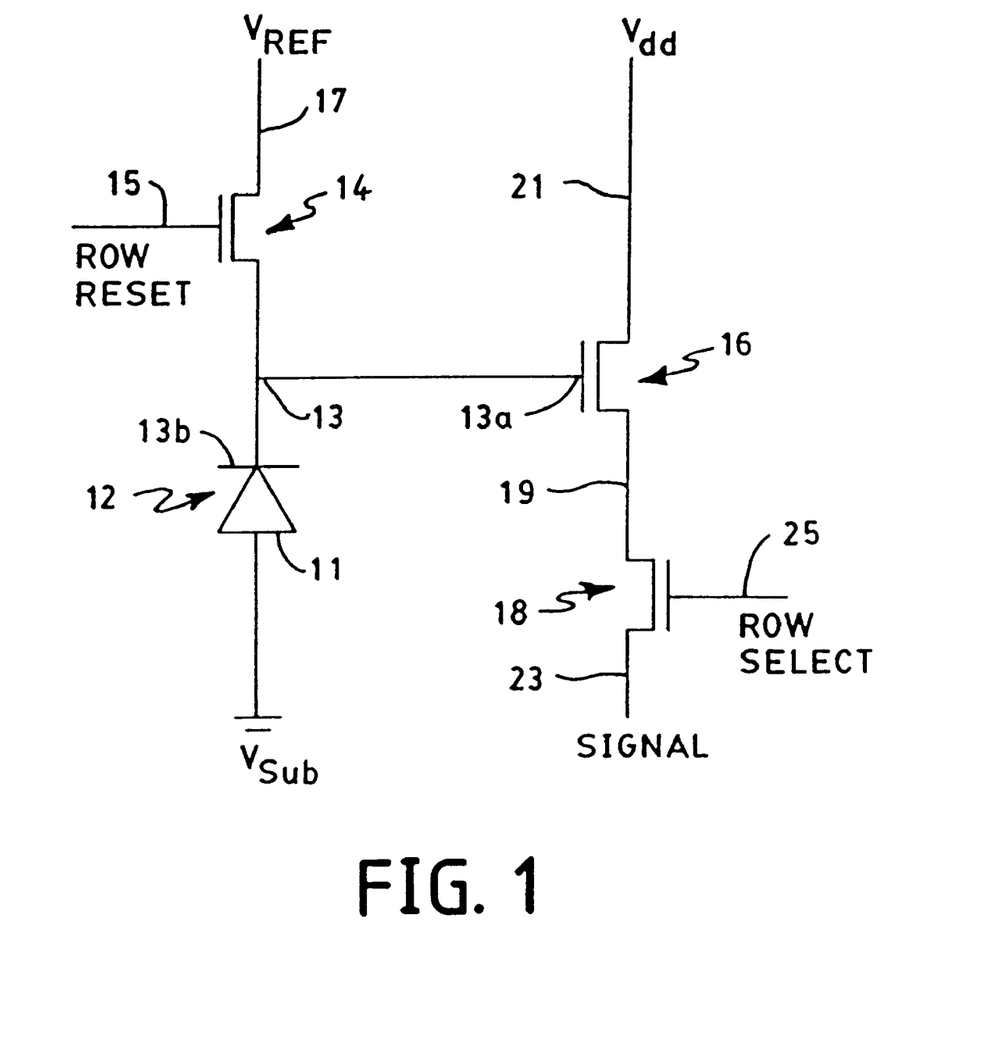
FIG. 1 a schematic circuit diagram of a pixel of a conventional CMOS image sensor.

Referring now first to FIG. 1, there is illustrated a schematic circuit diagram of a pixel 10 of a conventional CMOS image sensor. The radiation-sensitive element is a photo diode 12 comprising a p-n junction, wherein the p-doped junction side 11 is connected to a negative bias voltage $V_{sub}$ and the n-doped junction side 13b is connected via connection 13 to the drain terminal of a reset transistor 14 and to the gate 13a of a charge sensing transistor 16. The top surface of the pixel is generally at least partially covered with an electrically insulating field oxide (FOX) 30 which is transparent to the optical radiation. The source terminal 17 of the reset transistor 14 is biased to a positive reference bias voltage $V_{REF}$. The gate terminal 15 of the reset transistor 14 is connected to a common row reset line (not shown), as is known in the art. By applying a positive reset voltage to the row reset line, all photo diodes 12 in that row are reverse biased to the reference bias voltage VREF. When the reset voltage is removed while the photo diodes 12 are exposed to optical radiation, the charge stored in each photo diode 12 in the respective row decreases due to the induced leakage (photo) current generated by the photo-induced electron-hole pairs (8, 9a and 9b in FIGS. 2–5), causing the voltage at the gate 13a of the charge sensing transistor 16 to decrease proportionately. By applying a row select voltage to the gate 25 of a row select transistor 18, a signal representing the voltage at the gate 13a (and therefore also the charge stored in photo element 12) can be read out column-wise via signal lines connected in parallel to the source terminal 23 of each row select transistors 18 in a respective column.

As mentioned before, identical pixels represented by the active elements 12, 14, 16 and 18 are laid out in form of a matrix pattern comprised of rows and columns to form the CMOS image sensor. This pattern as well as the individual active elements are generated by a conventional CMOS processing flow known in the art. The starting material for the process flow is typically, as mentioned before, a p-type silicon substrate; if P-CMOS transistors are part of the device, then these transistors are typically defined by a first n-well implant, followed by a drive. N-MOS transistors, on the other hand, are usually formed directly in the p-type substrate. In the following, the invention will be described by way of example with reference to n-MOS devices only; the invention, however, is in no way limited to only n-MOS devices.

Figure 2:
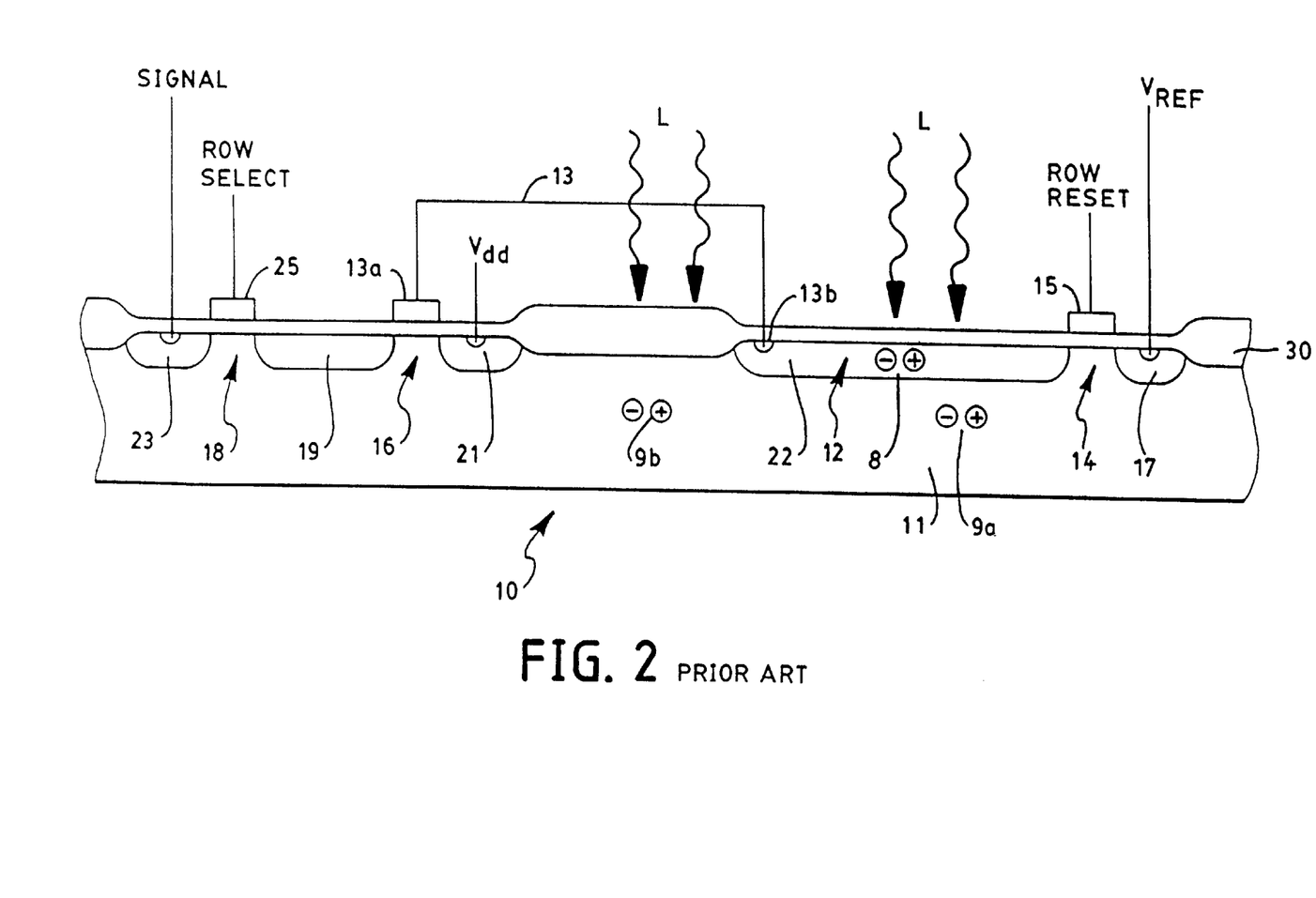
FIG. 2 a doping profile of a prior art CMOS image sensor in cross-section.
Figure 6:
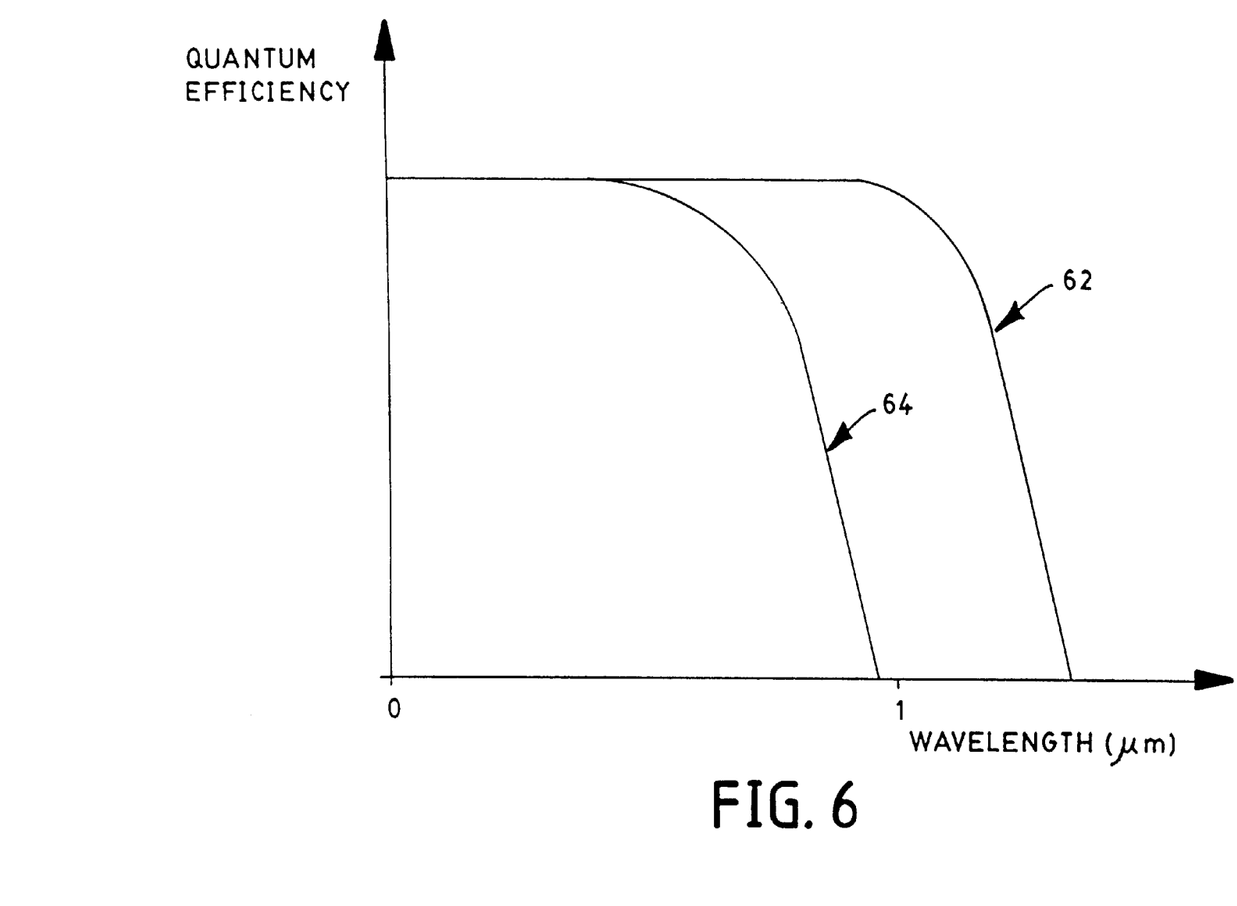
FIG. 6 the quantum efficiency of the CMOS image sensors of FIGS. 2 to 5.

The design of the active elements photodiode 12 and n-MOS transistors 14, 16 and 18 of a pixel can best be understood from FIG. 2. Shown in FIG. 2 is a prior art pixel design which is commonly found in devices having a larger pixel size. The photodiode 12 has an n-type region 22 contiguous with the drain region of transistor 14; transistors 14, 16 and 18 further comprise source/drain regions 17, 19, 21, 23 which are commonly fabricated directly in the p-type substrate 11 by implantation followed by a drive, with the implanted regions defined by conventional masking steps. The formation of the gates 13a, 15, 25 and the contact regions which have the same p-doping concentration as the substrate 11, is also well known in the art. Radiation L impinging on photodiode 12 and on an area laterally surrounding the photodiode 12 creates electron/hole pairs 8, 9a in the n- and p-regions, respectively, below the surface of the photodiode 12, and also electron/hole pairs 9b farther away from the photodiode 12 in the p-substrate under the FOX 30. The electrons of electron/hole pair 9a subsequently drift to the n-doped region 22 across the space charge region formed between the n-doped region 22 and the p-type substrate 11, whereas the holes of electron/hole pair 8 drift across said space charge region to the p-type substrate 11. A portion of the electrons of electron/hole pair 9b will also drift to the n-doped region 22, whereas another portion of these electrons which does not recombine directly with the holes in substrate 11, can reach the drain region 21 where the electrons are collected without contributing to the signal. The charge which drifts to the n-doped region 22 is stored in the reverse biased photo diode, causing the voltage between connection 13 and the substrate 11 to decrease, as discussed above. The charge accumulation in the respective n- and p-type layers is quite efficient and not very sensitive to the distance from the surface of the device at which the electron/hole pairs are generated, except for the charge carriers which are "lost" through spontaneous recombination. The quantum efficiency of the device of FIG. 2 is shown in FIG. 6 as curve 62.

Figure 3:
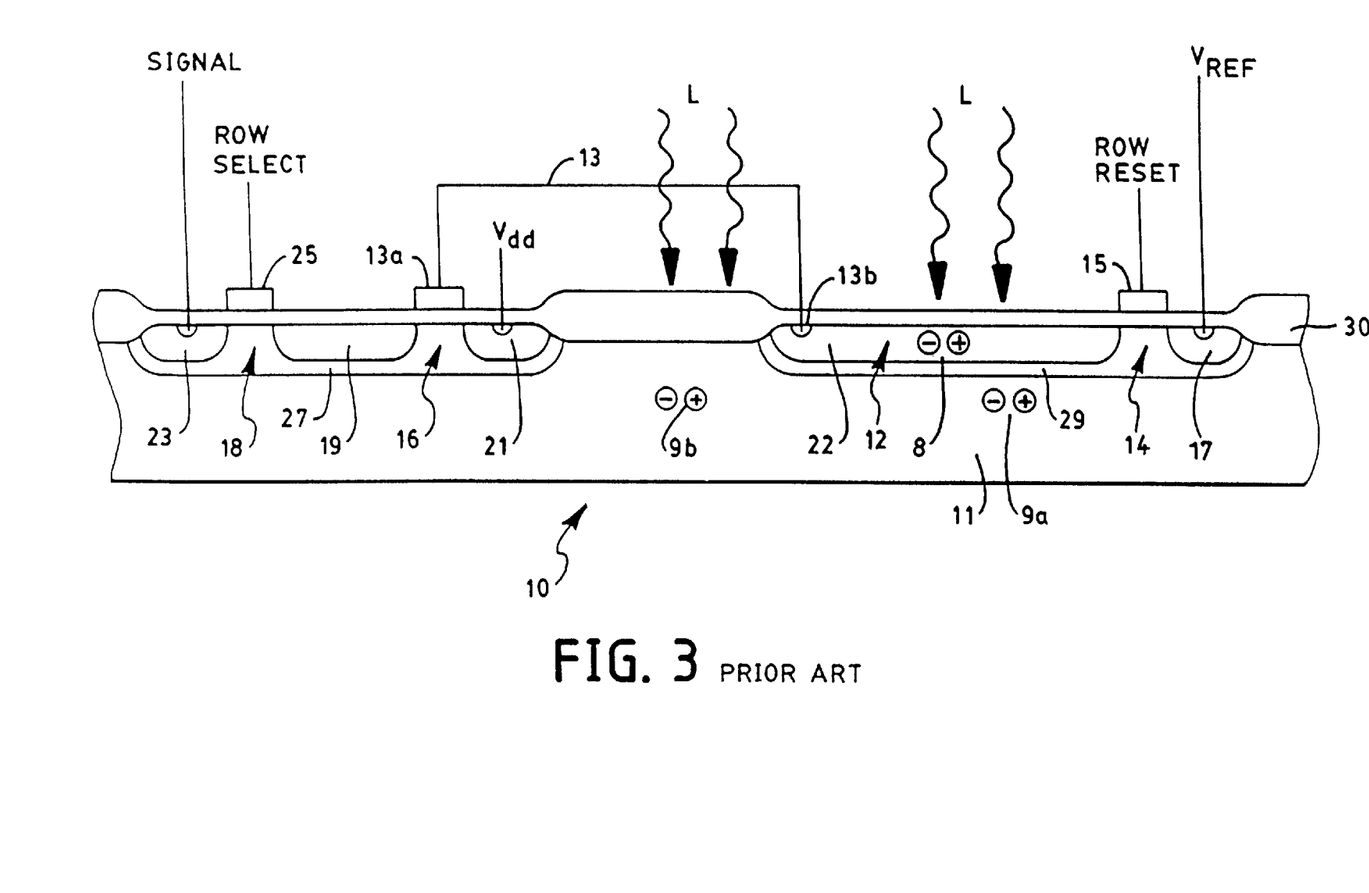
FIG. 3 a doping profile of another prior art CMOS image sensor in cross-section.

As mentioned before, the device of FIG. 2 is advantageous for applications in image sensors is the pixel size is sufficiently large as not to require high p- and n-doping levels. A prior art device with decreased feature size is depicted in FIG. 3. As discussed above, the doping concentration in the source/drain regions and in the gate regions of CMOS devices has to be increased when the device geometry shrinks, in order to be able to properly control the electrical characteristics of the device. In the pixel of FIG. 3, the photodiode 12 and transistors 14, 16 and 18 are formed in a p-doped region 27, 29 which is doped higher than the substrate and defines the gate regions of transistors 14, 16, 18; the higher p-doped layer 29 also extends laterally under the top n$^+$-layer 22 of the photodiode 12. The n$^+$-source/drain regions of these transistors is subsequently formed in the p-doped region 27, 29. As discussed above, electron-hole pairs 8, 9a and 9b are generated by the optical radiation L in the vicinity of the photodiode 12. Because the optical absorption coefficient in silicon, and in semiconductors in general, is larger for radiation at shorter wavelengths, optical radiation in the blue part of the optical spectrum is absorbed closer to the surface of the device than radiation with a longer wavelengths. Consequently, electron/hole pairs 9a and possibly also 9b are more likely generated by the red illumination, whereas electron/hole pair 8 is more likely generated by the blue illumination. In order to contribute to the charge accumulation in the photodiode 12, the electrons of electron/hole pair 9a and those of electron/hole pair 9b have to diffuse to the n$^+$-layer across the aforedescribed space charge region located at the p (29)-n$^+$ (22) interface of the photodiode 12. These electrons, however, are repelled by and/or have to overcome the adverse potential barrier created by p-layer 29 before reaching the n$^+$-layer 22. Consequently, this "obstacle" typically reduces the quantum efficiency (QE), i.e. the efficiency of the device to convert photons into electron-hole pairs, at longer wavelength. The QE of the device of FIG. 3 is shown in FIG. 6 as curve 64. It is evident from FIG. 6 that at longer wavelengths, the QE of curve 64 is disadvantageously lower than the QE of curve 62.

Figure 4:
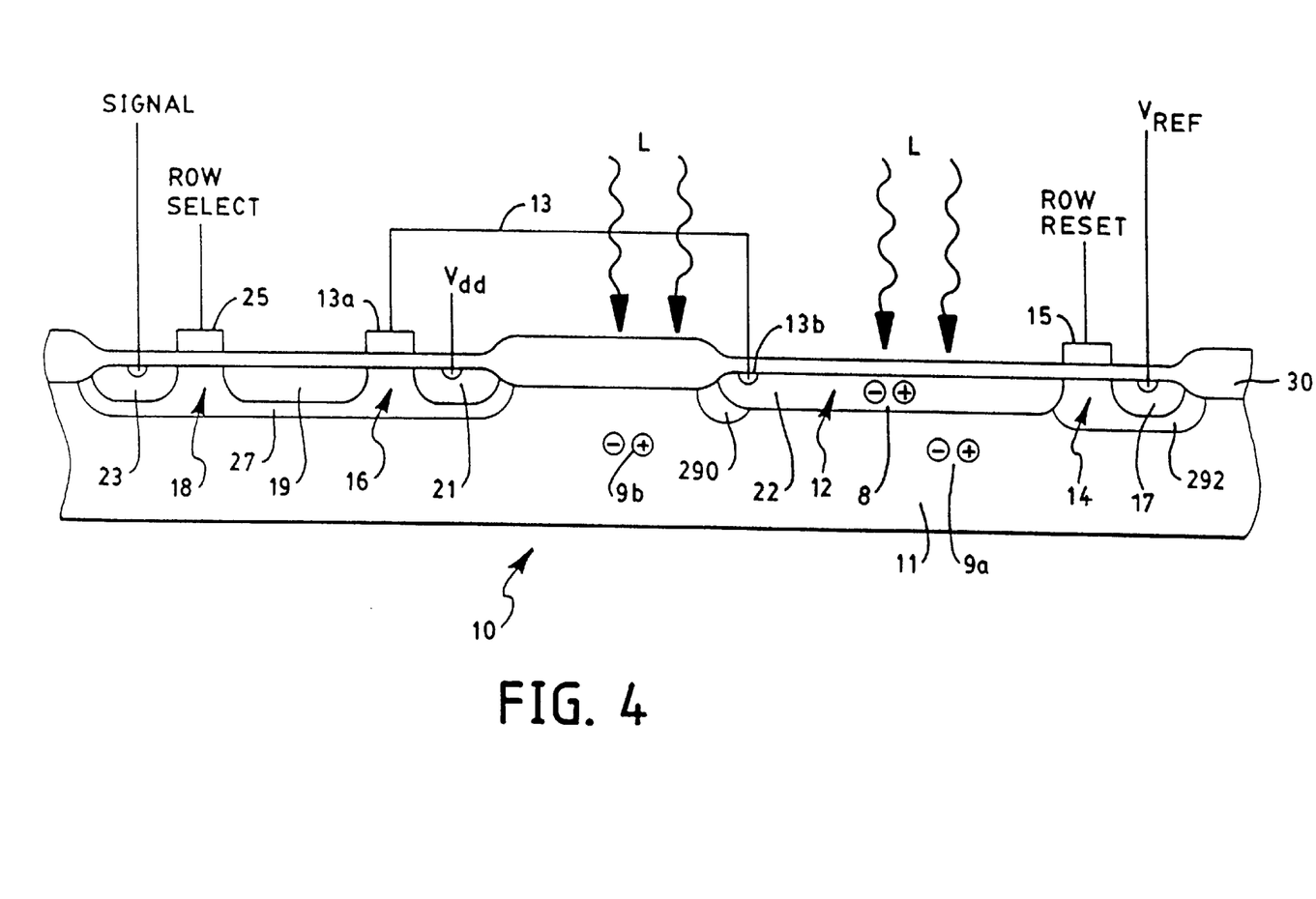
FIG. 4 a doping profile of an embodiment of the CMOS image sensor according to the invention in cross-section.

With the foregoing in mind, it is therefore desirable to increase the QE of pixels having small feature sizes, in particular at longer wavelengths. Referring now to FIG. 4, there is depicted in cross section an embodiment of a CMOS pixel according to the invention. The important difference between the CMOS pixel of the invention of FIG. 4 and the prior art pixel of FIG. 3 is that the p-doped layer 29 is no longer contiguous in FIG. 4, but is instead broken up into a marginal region 290 along the lateral edge of photodiode 12 and the gate region 292 of transistor 14. It is understood by those skilled in the art that the marginal region 290 is not essential for the present invention.

As mentioned before, the electrons of electron/hole pair 9a and 9b generated in the p-region 11 of the photo diode 12 have to reach the n$^+$-region 22 in order to be able to contribute to the charge integration process during exposure to the impinging radiation. In FIG. 3, the p-layer 29 effectively prevented the electrons from reaching the n$^+$-region 22. By omitting the layer 29 in the device of the invention of FIG. 4, and by only doping the regions 290 and 292, the electrons of electron/hole pair 9a and 9b are now again able to reach the n$^+$-region 22. In effect, the lateral p-doped regions 290 and 292, essentially "channel" the electrons to the n$^+$-region 22. Consequently, the high quantum efficiency of CMOS image sensors with large feature sizes can now advantageously also be attained with the CMOS image sensors having a small feature size. The optical response, i.e. the quantum efficiency, of the CMOS image sensor of the invention is thus again advantageously represented by the curve 62 in FIG. 6.

Figure 5:
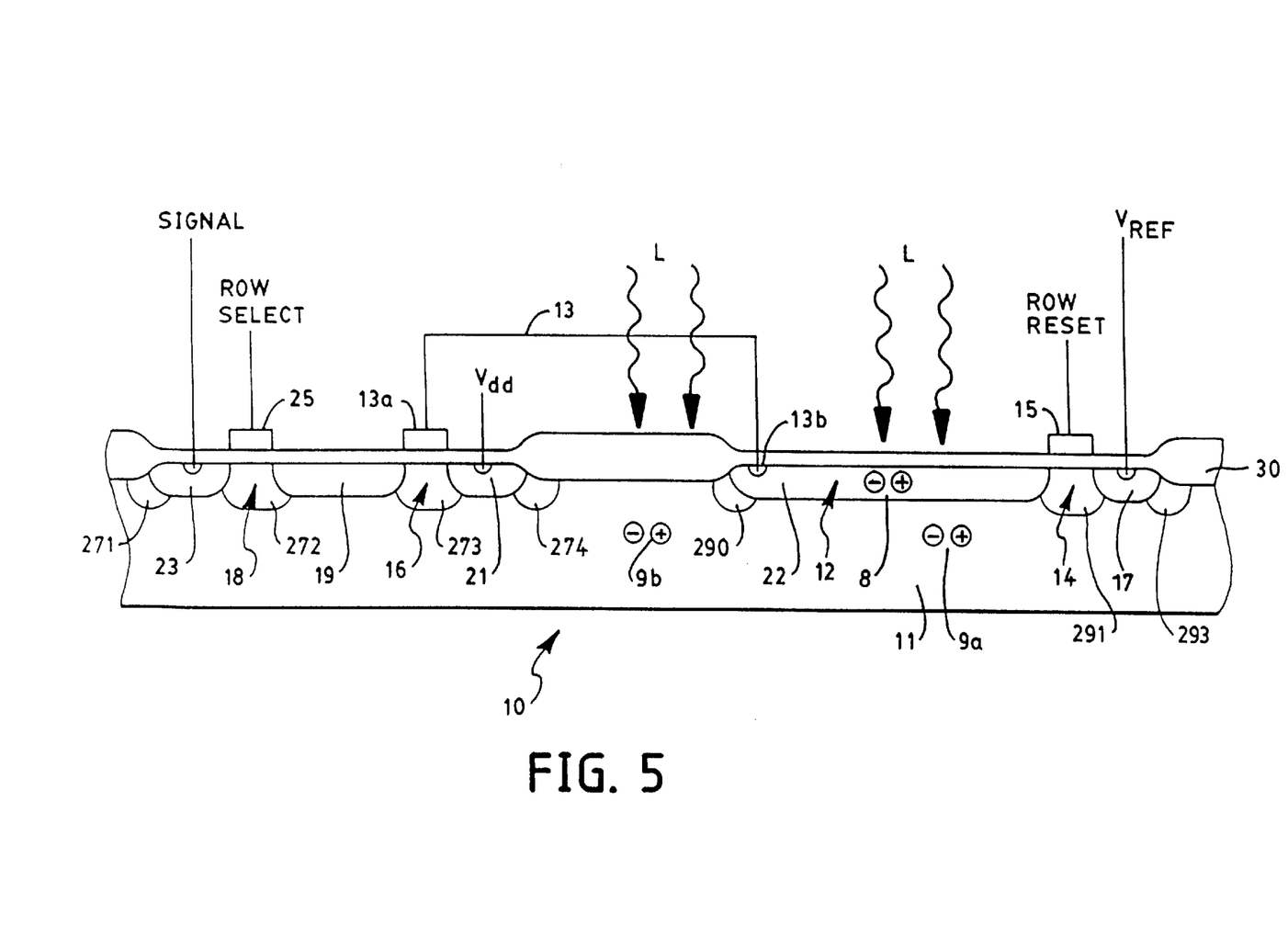
FIG. 5 a doping profile of another embodiment of the CMOS image sensor according to the invention in cross-section with anti-blooming protection.

In a yet another advantageous embodiment illustrated in FIG. 5, the p-doped region 292 which was shown in FIG. 4 to be contiguous underneath the n$^+$-doped source region 17 of row reset transistor 14, can instead be comprised of separate regions 291 and 293. Similarly, the p-doped region 27 of transistors 16 and 18 can also be split up into separate regions 271, 272, 273 and 274, as is indicated in FIG. 5. The design of FIG. 5 can advantageously be used to prevent blooming. Blooming occurs when the illumination level exceeds the saturation level in a photo element, i.e. the level where electrons and holes generated by the optical radiation can no longer be "stored" in the photo element. These "excess" charges then migrate, i.e. spill over, to adjacent pixels. If the photo element of the adjacent pixel is not saturated, then a signal is generated in the adjacent pixel will show a higher illumination than the actual illumination.

Blooming can be effectively reduced and even eliminated by moving the excess charges to regions where they do not contribute to the signal. Since electrons tend to diffuse to any reverse biased n-doped region of the device, such excess electrons will preferably be attracted by regions 17, 19, 21 and 23 of FIG. 5. In this way, excess charges are drained to $V_{DD}$, $V_{REF}$ and other areas representing current sinks without contributing to the image signal.

Excess charges can also be drained from the photo element 12 by applying a positive voltage $V_{Sub}+V_T$ to terminal 15 which leaves the channel of row reset transistor 14 open.

While there have been described what at present are considered to be the preferred embodiments of the present invention, it will be readily apparent to those skilled in the art that various changes may be made therein without departing from the invention, such as selecting a substrate with a different doping type, rearranging the placement of the elements within a pixel and the like, and it is intended in the claims to cover such changes and modifications as fall within the true spirit and scope of the invention.

What is claimed:

1. A CMOS image sensor element formed in a semiconductor substrate of a first doping type for converting impinging electromagnetic radiation into electric signals, the sensor element comprising:

a first well formed in said substrate and doped with the first doping type to a higher doping level than the substrate, wherein at last a portion of said first well defines the gate region of a first transistor;

a second well formed in said first well and doped with a second doping type, said second well defining the source of the first transistor;

a third well formed substantially in said substrate and doped with the second doping type, said third well defining a photodiode and the drain of the first transistor; and a fourth well formed in said substrate and doped with the first doping type to a higher doping level than the substrate, said fourth well defining the gate region of a second transistor;

so that electric charges generated by the electromagnetic radiation in the semiconductor substrate proximate to said third well and said fourth well are preferably collected in said third well whereby quantum efficiency can be maintained with reduced feature size of said sensor element.

2. The image sensor element of claim 1, wherein said first well extends at least partially along the periphery of said third well.

3. The image sensor element of claim 1 wherein the second transistor further comprises:

a plurality of fifth wells formed in said substrate and doped with the second doping type, wherein each of said plurality of fifth wells defines a respective source and drain of the second transistor;

wherein said fourth well extends at least partially along the periphery of said plurality of fifth wells, so that excess electric charges generated by the electromagnetic radiation proximate to said third well are preferably collected in said fifth wells to prevent blooming.

4. The image sensor element of claim 1, wherein said substrate is p-type silicon.

5. The image sensor element of claim 1, wherein said substrate is an epitaxial layer of p-type silicon disposed on a carrier.

6. The image sensor element of claim 4, wherein the thickness of the third well is between 0.05 $\mu$m and 1.0 $\mu$m.

7. The image sensor element of claim 4, wherein the third well is doped n-type and the dopant concentration in the third region is between $1\times10^{19}$ cm$^{-3}$ and $1\times10^{21}$ cm$^{-3}$.

8. The image sensor of claim 1, wherein the dopant concentration in the first well is between $1\times10^{16}$ cm$^{3}$ and $1\times10^{18}$ cm$^{-3}$.

9. An image sensor formed in a semiconductor substrate of a first doping type in the form of an array of pixel elements arranged in a matrix pattern of rows and columns, said substrate having a surface, wherein each of the pixel elements includes a photodiode for receiving electromagnetic radiation and converting said electromagnetic radiation into electric charges, a plurality of transistors for controlling and sensing said electric charges, each transistor having a source, a drain and a gate, and connections for interconnecting said photodiode and said transistor in a manner as to enable row-wise and column-wise addressing of said image sensor, the pixel comprising:

a plurality of first regions formed in said substrate and doped with the first doping type at a higher dopant concentration than said substrate, said first regions forming the transistor gate regions;

a plurality of second regions formed in the substrate and doped with a second doping type, said second regions laterally defining the transistor source and drain regions;

a third region formed in said substrate and doped with the second doping type and laterally defining the photodiode, said third region laterally contiguous with the drain of at least one of the transistors;

wherein said first regions extend also along at least a portion of the peripheral marginal regions of the second and third regions, so that the electric charges generated proximate to said third region are preferably collected in said third region and excess electric charges are preferably collected in said second regions to prevent blooming.

10. The image sensor of claim 9, wherein the image sensor is a CMOS device.

11. The image sensor of claim 9, wherein the thickness of the third region formed in the semiconductor substrate is between 0.05 $\mu$m and 1.0 $\mu$m.

12. The image sensor of claim 9, wherein the substrate is p-type silicon.

13. The image sensor of claim 12, wherein the third region is doped n-type and the dopant concentration in the third region is between $1\times10^{19}$ cm$^{-3}$ and $1\times10^{21}$ cm$^{-3}$.

14. The image sensor of claim 9, wherein the dopant concentration in the first region is at least as high as the dopant concentration in the substrate.

15. The image sensor of claim 9, wherein the dopant concentration in the first region is between $1\times10^{16}$ cm$^{-3}$ and $1\times10^{18}$ cm$^{-3}$.

16. The image sensor of claim 9, wherein the dopant concentrations in the second region and in the third region are identical.

* * * * *